United States Patent
Smirnow et al.

(10) Patent No.: US 12,255,611 B2
(45) Date of Patent: Mar. 18, 2025

(54) THIN-FILM SAW DEVICE WITH MULTILAYER WAVEGUIDE

(71) Applicant: RF360 Singapore Pte. Ltd., Republic Plaza (SG)

(72) Inventors: Michael Smirnow, Munich (DE); Matthias Knapp, Munich (DE)

(73) Assignee: RF360 Singapore Pte. Ltd., Singapore (SG)

( * ) Notice: Subject to any disclaimer, the term of this patent is extended or adjusted under 35 U.S.C. 154(b) by 744 days.

(21) Appl. No.: 17/441,197

(22) PCT Filed: Mar. 30, 2020

(86) PCT No.: PCT/EP2020/058983
§ 371 (c)(1),
(2) Date: Sep. 20, 2021

(87) PCT Pub. No.: WO2020/201222
PCT Pub. Date: Oct. 8, 2020

(65) Prior Publication Data
US 2022/0173713 A1  Jun. 2, 2022

(30) Foreign Application Priority Data
Apr. 5, 2019  (DE) .................... 10 2019 109 031.8

(51) Int. Cl.
*H03H 9/02*  (2006.01)
(52) U.S. Cl.
CPC .... *H03H 9/02574* (2013.01); *H03H 9/02535* (2013.01); *H03H 9/02834* (2013.01)

(58) Field of Classification Search
CPC .......... H03H 9/02574; H03H 9/02535; H03H 9/02834
(Continued)

(56) References Cited

U.S. PATENT DOCUMENTS

| | | |
|---|---|---|
| 2014/0203893 A1 | 7/2014 | Kando et al. |
| 2015/0028720 A1 | 1/2015 | Kando |

(Continued)

FOREIGN PATENT DOCUMENTS

| | | |
|---|---|---|
| CN | 109417124 A | 3/2019 |
| FR | 3053532 A1 | 1/2018 |
| JP | 2015154492 A | 8/2015 |

OTHER PUBLICATIONS

International Search Report and Written Opinion—PCT/EP2020/058983—ISA/EPO—Jun. 29, 2020.
(Continued)

*Primary Examiner* — Derek J Rosenau
(74) *Attorney, Agent, or Firm* — Polsinelli

(57) ABSTRACT

In at least one embodiment, the SAW device comprises a carrier substrate (1), a piezoelectric thin-film (2) on the carrier substrate, an interdigital electrode structure (3) on the piezoelectric thin-film and a layer stack (4) of waveguide layers. The layer stack is arranged between the carrier substrate and the piezoelectric thin-film. The layer stack comprises a first waveguide layer (41) and second waveguide layer (42), wherein a sound velocity in the first waveguide layer is at least 1.5 times as great as in the second waveguide layer. The device may comprise a temperature compensating layer (5) and a trap rich layer (6) between the layer stack and the carrier substrate.

15 Claims, 2 Drawing Sheets

(58) Field of Classification Search
USPC ...... 310/313 R, 313 A, 313 B, 313 C, 313 D
See application file for complete search history.

(56) References Cited

U.S. PATENT DOCUMENTS

| | | |
|---|---|---|
| 2015/0102705 A1 | 4/2015 | Iwamoto et al. |
| 2017/0033764 A1 | 2/2017 | Inoue et al. |
| 2017/0331449 A1 | 11/2017 | Watanabe et al. |
| 2018/0152169 A1 | 5/2018 | Goto et al. |
| 2019/0068161 A1 | 2/2019 | Kimura |
| 2019/0165763 A1* | 5/2019 | Mimura ............. H03H 9/02834 |
| 2019/0372552 A1 | 12/2019 | Gaudin et al. |

OTHER PUBLICATIONS

Xun C., et al., "Modern Thin Film Materials and Technology", East China University of Science and Technology Press, Open Day, Sep. 30, 2007, 4 Pages.

* cited by examiner

THIN-FILM SAW DEVICE WITH MULTILAYER WAVEGUIDE

A SAW device is specified.

One object to be achieved is to specify a SAW device (SAW=Surface Acoustic Wave) which can be used in the ultrahigh frequency range.

This object is achieved, inter alia, by the SAW device according to independent claim 1. Advantageous embodiments and further developments are the subject-matter of the dependent claims.

According to at least one embodiment, the SAW device comprises a carrier substrate. The carrier substrate is preferably self-supporting. The carrier substrate may be integrally formed, i.e. formed in one piece. The carrier substrate may comprise or consist of silicone, sapphire, silicon carbide, diamond or aluminium nitride. The carrier substrate may have a mean thickness of at least 10 µm or at least 50 µm or at least 100 µm. Additionally or alternatively, the mean thickness of the carrier substrate may be at most 1 mm or at most 500 µm.

According to at least one embodiment, the SAW device comprises a piezoelectric thin-film on the carrier substrate. The piezoelectric thin-film may be integrally formed.

The piezoelectric thin-film establishes a piezoelectric material of the SAW device. During the intended operation of the SAW device, surface acoustic waves propagate along or in the piezoelectric thin-film. A thin-film is characterized in that wafer bonding with thin-film processing or thin-film deposition techniques are used to arrange a material on the carrier substrate. Thin-film processing can be, e.g., mechanical grinding or what is known as "smart cut". A thin-film deposition technique can be, e.g., a physical vapor deposition technique or a chemical vapor deposition technique. Molecular beam epitaxy techniques can be used to provide the thin-film. Sputtering is also possible.

The piezoelectric thin-film may comprise or consist of $LiTaO_3$ or $LiNbO_3$ or quartz or AlN or a further piezoelectric material.

According to at least one embodiment, the SAW device comprises an interdigital electrode structure on the piezoelectric thin-film. In particular, the interdigital electrode structure is located on a side of the piezoelectric thin-film facing away from the carrier substrate.

The interdigital electrode structure comprises two electrodes, each with a plurality of fingers. The fingers of the two electrodes interdigitate but are electrically isolated from one another. The fingers of an electrode are electrically connected by a busbar. Each electrode may comprise at least 10 fingers or at least 50 fingers or at least 100 fingers. The interdigital electrode structure on the piezoelectric thin-film preferably forms an interdigital transducer (IDT).

The electrodes of the interdigital electrode structure are each preferably made of a metal, like Cu or Al or Pt or Ag or Au or Ti or Cr, or of a compound or of a metal alloy thereof. The electrodes may be integrally formed or may have a layered structure. The electrodes may each be in direct contact with the piezoelectric thin-film. The interdigital electrode structure may be passivated by a dielectric material, e.g. $SiO_2$ or $Si_3N_4$, in order prevent contamination.

According to at least one embodiment, the SAW device comprises a layer stack of waveguide layers, said layer stack being arranged between the carrier substrate and the piezoelectric thin-film. The layer stack may be in direct contact with the piezoelectric thin-film and/or the carrier substrate. The layer stack may comprise at least two or at least four or at least six or at least eight or at least ten or at least 20 or at least 50 waveguide layers. Each of the waveguide layers is preferably integrally formed. The waveguide layers are preferably each formed from a dielectric material. The waveguide layers may be thin-films. Each two adjacent waveguide layers comprise or consist of different materials. Particularly, an interface is formed between each two waveguide layers.

The waveguide layers of the layer stack are stacked one above the other in a direction from the carrier substrate to the piezoelectric thin-film. In a top view, each of the waveguide layers preferably completely overlaps with the interdigital electrode structure.

According to at least one embodiment, the layer stack comprises a first waveguide layer and a second waveguide layer. The first waveguide layer and the second waveguide layer are preferably adjacent layers which are in direct contact to each other. The layer stack may consist of the first waveguide layer and the second waveguide layer. Preferably, however, the layer stack comprises more than two waveguide layers.

According to at least one embodiment, a sound velocity in the first waveguide layer is at least 1.5 as great or at least 2 times as great or at least 2.5 times as great or at least 3 times as great as a sound velocity in the second waveguide layer.

Here and in the following sound velocities of sound waves which have the same direction of propagation and/or which are of the same mode, for example of transverse or longitudinal mode or a mixture thereof, are preferably compared. Particularly, the interdigital electrode structure is part of a SAW resonator. During the intended operation of the SAW resonator, a main sound wave/main acoustic wave is generated in the resonator. The main sound wave is the wanted sound wave of the resonator. The main sound wave propagates along a longitudinal direction. A comparison between sound velocities preferably refers to sound velocities along this longitudinal direction. The longitudinal direction is particularly a direction perpendicular to the main extension directions of the fingers of the electrodes and parallel to a surface of the piezoelectric thin-film facing the electrode structure.

It is also possible to define the sound velocity in a medium as $v=(c_{ij}/\rho)^{1/2}$, where $c_{ij}$ is a component of the elasticity tensor and $\rho$ is the density in the medium in which the sound wave propagates. When comparing sound velocities, the sound velocities $v=(c_{11}/\rho)^{1/2}$ may be compared.

In at least one embodiment, the SAW device comprises a carrier substrate, a piezoelectric thin-film on the carrier substrate, an interdigital electrode structure on the piezoelectric thin-film and a layer stack of waveguide layers. The layer stack is arranged between the carrier substrate and the piezoelectric thin-film. The layer stack comprises a first waveguide layer and a second waveguide layer, wherein a sound velocity in the first waveguide layer is at least 1.5 times as great as in the second waveguide layer.

The present invention is, inter alia, based on the realization that the evolution of next-generation mobile communication systems requires devices with an outstanding combination of various performance criteria, for example high-frequency, high quality factor (Q), large electromechanical coupling ($k^2$) and low temperature coefficient of frequency (TCF). For low and mid band LTE applications, for example in the range of 1 GHz to 2.5 GHz, conventional SAW devices are sufficient. However, future applications require devices operating at up to 6 GHz, which cannot be supported by conventional SAW devices, so far.

The inventors of the present invention had the idea to use a thin-film SAW (TF-SAW) device with a piezoelectric thin-film on a carrier substrate. A stack of waveguide layers is arranged between the carrier substrate and the piezoelectric thin-film. The stack of waveguide layers comprises layers having different sound velocities. This has a waveguide effect on the sound waves in the piezoelectric thin-film and prevents the propagation of these sound waves from leaking energy to the carrier substrate. Thus, the efficiency of the SAW device is increased. A high efficiency is very important for SAW devices operating in the high frequency range.

According to at least one embodiment, the layer stack comprises several of the first waveguide layers and several of the second waveguide layers, wherein the first waveguide layers and the second waveguide layers are arranged alternately. All features disclosed before and in the following for one first waveguide layer may apply to all of the first waveguide layers. Likewise, all features disclosed before and in the following for one second waveguide layer may apply to all of the second waveguide layers. Particularly, sound velocities in the first waveguide layers are at least 1.5 times or at least 2 times or at least 2.5 times or at least 3 times as great as in the second waveguide layers.

For example, the layer stack has the same number of first waveguide layers and second waveguide layers. For example, the layer stack comprises at least two or at least four or at least six or at least eight or at least ten or at least 20 or at least 50 first waveguide layers. The same numbers may apply for the second waveguide layers. Preferably, between each two second waveguide layers there is a first waveguide layer and between each two first waveguide layers there is a second waveguide layer.

Each first waveguide layer is preferably in direct contact with two second waveguide layers and each second waveguide layer is preferably in direct contact with two first waveguide layers. All of the first waveguide layers may be constructed identically within the manufacturing tolerance. Likewise, all of the second waveguide layers may be constructed identically within the manufacturing tolerance. For example, all of the first waveguide layers consist of the same material or same material composition and/or have the same mean thickness. Likewise, the second waveguide layers may all consist of the same material or same material composition and/or may have the same mean thickness.

By increasing the amount of first waveguide layers and second waveguide layers, the reflectivity of the layer stack can be increased and the trapping of the sound wave in the piezoelectric thin-film can be further improved.

The piezoelectric thin-film may be in direct contact with a first waveguide layer or a second waveguide layer of the layer stack.

According to at least one embodiment, the sound velocity in the first waveguide layer is greater than a sound velocity in the piezoelectric thin-film. Preferably, as already explained, sound velocities of similar sound waves are compared, i.e. of sound waves which have the same propagation direction and/or which are of the same mode. For example, the sound velocity in the first waveguide layer is at least 1.2 times as great or at least 1.5 times as great or at least 2 times as great as in the piezoelectric thin-film.

According to at least one embodiment, the sound velocity in the second waveguide layer is smaller than the sound velocity in the piezoelectric thin-film. For example, the sound velocity in the second waveguide layer is at most 0.85 times as great or at most 0.75 times as great or at most 0.5 times as great as in the piezoelectric thin-film.

According to at least one embodiment, a mean thickness of the first and/or second waveguide layer is at most $\lambda/4$ or at most $\lambda/8$ or at most $\lambda/16$. Preferably, the mean thickness of the first and/or second waveguide layer is at least 5 nm or at least 10 nm. Thereby, $\lambda$ denotes the wavelength of a main sound wave during operation of the SAW device. Preferably, $\lambda$ is the wavelength of the main sound wave of a SAW resonator of the SAW device, wherein the interdigital electrode structure on the piezoelectric thin-film forms an IDT of the SAW resonator. Particularly, $\lambda$ is defined by the pitch between two fingers of one electrode of the interdigital electrode structure.

Absolute values of the mean thickness of the first and/or the second waveguide layer may be between 5 nm and 500 nm inclusive, preferably between 10 nm and 300 nm inclusive.

Here and in the following, a layer or film is preferably understood to have a constant thickness over its entire extension within the manufacturing tolerance. For example, a maximum deviation of the thickness of a layer or film from its mean thickness is at most 10% or at most 5%.

According to at least one embodiment, a mean thickness of the piezoelectric thin-film is at most $0.6 \cdot \lambda$ or at most $0.5 \cdot \lambda$ or at most $0.5 \cdot \lambda$. Additionally or alternatively, a mean thickness of the piezoelectric thin-film may be at least $0.1 \cdot \lambda$ or at least $0.15 \cdot \lambda$ or at least $0.2 \cdot \lambda$.

According to at least one embodiment, the first waveguide layer comprises or consists of one or more of the following materials: AlN, SiC, $Al_2O_3$, diamond like carbon, TiN.

According to at least one embodiment, the second waveguide layer comprises or consists of one or more of the following materials: $SiO_2$, $Si_3N_4$, doped $SiO_2$, $GeO_2$.

According to at least one embodiment, the SAW device comprises a TCF compensating layer having a positive temperature coefficient of frequency. The TCF compensating layer is arranged between the layer stack and the carrier substrate. The TCF compensating layer may have a thickness between $0.1 \cdot \lambda$ and $0.5 \cdot \lambda$ inclusive, preferably between $0.2 \cdot \lambda$ and $0.4 \cdot \lambda$ inclusive. The TCF compensating layer is preferably dielectric. The TCF compensating layer may comprise or consist of one or more of the following materials: $SiO_2$, doped $SiO_2$, $GeO_2$, ScYF, $ZrW_2O_8$, $ZrMo_2O_8$, $HfMo_2O_8$, $ScW_3O_{12}$, $AlW_3O_{12}$, $Zr(WO_4)(PO_4)_2$, zeolites, $B_2O_3$ or other materials with a positive TCF (TCF=temperature coefficient of frequency). Like the waveguide layers, the TCF compensating layer may overlap with the whole interdigital electrode structure when viewed in a top view. The TCF compensating layer may be in direct contact with the layer stack of waveguide layers.

A TCF compensating layer with a positive temperature coefficient of frequency can counteract a negative TCF of the piezoelectric thin-film or of the layer stack of waveguide layers. Moreover, TCF compensating layers mostly show a negative coefficient of thermal expansion which is especially true for materials selected from transition metal compounds and compounds of rare earth metals. These materials also show a high positive temperature coefficient of their E-module, that is an enhanced stiffness at higher temperatures.

According to at least one embodiment, a dielectric ion blocking layer is arranged between the layer stack and the carrier substrate. Preferably, the ion blocking layer is arranged between the TCF compensating layer and the carrier substrate. The ion blocking layer may comprise or consist of polycrystalline silicon or ion implanted silicon. The ion blocking layer can trap existing ions in the SAW device and can thus reduce losses due to those free charges. A mean thickness of the ion blocking layer may be in the range of 200 nm to 1.5 μm inclusive.

A mean thickness of the interdigital electrode structure, particularly a mean thickness of the fingers of the electrodes, is preferably between 10 nm and 1 μm inclusive. The thickness of the electrode structure is measured as the expansion perpendicular to the surfaces of the piezoelectric thin-film onto which the interdigital electrode structure is applied.

According to at least one embodiment, the SAW device comprises a SAW resonator. The interdigital electrode structure on the piezoelectric thin-film preferably forms an interdigital transducer, IDT for short, of the SAW resonator. The SAW resonator may further comprise two reflectors arranged on the piezoelectric thin-film, between which the interdigital electrode structure is located. The reflectors may comprise or consist of the same material as the interdigital electrode structure.

The SAW device may comprise one or more SAW resonators. Each of the SAW resonators preferably comprises an interdigital electrode structure forming an IDT. The interdigital electrode structures are preferably all formed on the same piezoelectric thin-film. In a top view, the layers specified above, in particular the waveguide layers of the layer stack, may completely overlap with all of the interdigital electrode structures of the SAW resonators. Especially, the SAW device comprises a SAW filter with several SAW resonators or is such a SAW filter. The SAW device can be part of a filter circuit, for example of a duplexer or a multiplexer.

According to at least one embodiment, the SAW resonator has a resonant frequency of at least 2.5 GHz or at least 3 GHz or at least 5 GHz. Additionally or alternatively, the resonant frequency is at most 10 GHz or at most 8 GHz or at most 6 GHz. The resonant frequency is the wanted resonant frequency at which the SAW resonator is intended to be operated.

Hereinafter, a SAW device described herein will be explained in more detail with reference to drawings on the basis of exemplary embodiments. Same reference signs indicate same elements in the individual figures. However, the size ratios involved are not to scale, individual elements may rather be illustrated with an exaggerated size for a better understanding.

Figure 1:
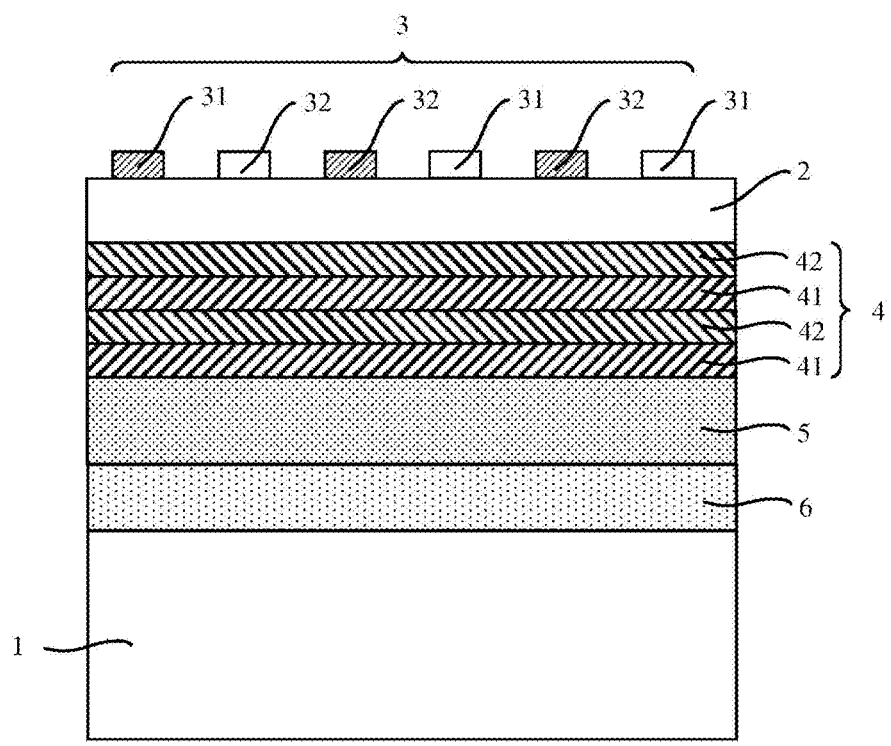
FIG. 1 shows an exemplary embodiment of a SAW device in cross-sectional view.

FIG. 1 shows an exemplary embodiment of the SAW device in a cross-sectional view. The SAW device comprises a carrier substrate 1, on which the piezoelectric thin-film 2 is applied. On top of the piezoelectric thin-film 1, an interdigital electrode structure 3 comprising two electrodes 31, 32, each with a plurality of interdigitating fingers, is applied. Between the piezoelectric thin-film 2 and the carrier substrate 1, a layer stack 4 of waveguide layers is located. The layer stack 4 consists of four waveguide layers 41, 42. Two of the waveguide layers are first waveguide layers 41 and the other two waveguide layers are second waveguide layers 42. The first 41 and second 42 waveguide layers are stacked in an alternating fashion. The first waveguide layers 41 are identical within the manufacturing tolerance. Likewise, the second waveguide layers 42 are identical within the manufacturing tolerance.

Between the layer stack 4 and the carrier substrate 1, a TCF compensating layer 5 with a positive temperature coefficient of frequency is arranged. Moreover, a dielectric ion blocking layer 6 is arranged between the TCF compensating layer 5 and the carrier substrate 1.

The SAW device of FIG. 1 may be a SAW resonator. Reflectors of the SAW resonator are not shown. A sound velocity in the first waveguide layers 41 is at least 1.5 times as great as a sound velocity in the second waveguide layers 42. For example, the sound velocities are each measured for sound waves propagating in the same direction as the main sound wave of the SAW resonator, which, in FIG. 1, can be a direction from the left to the right or vice versa.

In the exemplary embodiment of FIG. 1, the carrier substrate 1 is a Si substrate with cut angles of (0°, 0°, 45°) and having a thickness of at least 20 μm. The ion blocking layer 6 is made of polycrystalline Si with a mean thickness of 250 nm. The TCF compensating layer 5 is a $SiO_2$ layer with a mean thickness of 200 nm. The first waveguide layers 41 are AlN layers each with a mean thickness of 190 nm. The second waveguide layers 42 are $SiO_2$ layers each with a mean thickness of 105 nm. The piezoelectric thin-film 2 is a $LiNbO_3$ thin-film with cut angle of (0°, 170°, 0°) and a mean thickness of 100 nm. The electrode structure 3, 31, 32 is based on Al and has a mean thickness of 80 nm. However, the specified materials, cut angles and thicknesses are only to be understood as an example. In fact, depending on the intended application of the SAW device, the materials, thicknesses and cut angles and also the number of waveguide layers may vary. Particularly preferably, the layer stack 4 comprises more than two first waveguide layers 41 and more than two second waveguide layers 42.

The cut angles ($\lambda'$, $\mu$, $\theta$) are the Euler angles defining the orientation of a top surface of a substrate or carrier or layer with respect to the crystallographic axes of the substrate or carrier or layer. The definition is in accordance with the International Standard IEC 62276:2016.

Figure 2:
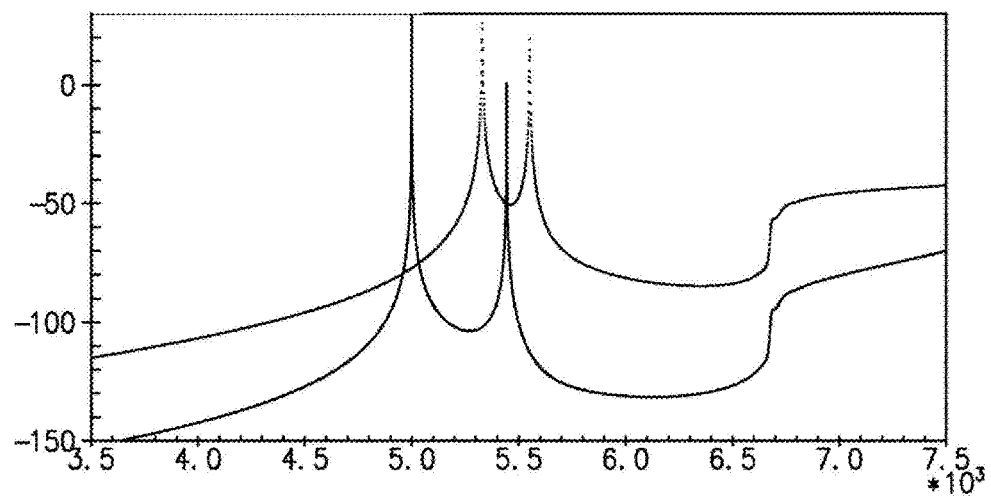
FIGS. 2 and 3 show simulations of the admittance of an exemplary embodiment of a SAW resonator and of a SAW resonator without a layer stack of waveguide layers.
Figure 3:
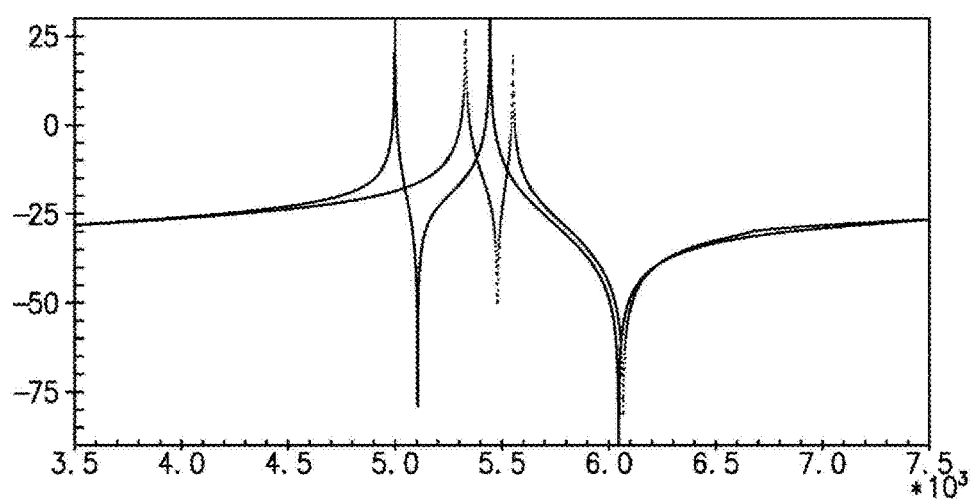

FIGS. 2 and 3 show a simulation of the admittance of a simulated SAW resonator according to the present invention (solid line) compared to a simulated SAW resonator which does not comprise the layer stack of waveguide layers (dotted line). For example, the simulated SAW resonator according to the present invention is the SAW resonator according to the exemplary embodiment of FIG. 1.

In FIG. 2 the real part of the admittance and in FIG. 3 the absolute value of the admittance are shown. The y-axes each show the magnitude in dB, whereas the x-axes each show the frequency in MHz.

The introduction of the layer stack of waveguide layers with different sound velocities significantly improves the waveguiding, which can be seen in the lower level of the solid line compared to the dotted line in FIG. 2. Additionally, the layer stack of waveguide layers significantly increases $k^2$, which can be seen in FIG. 3. The improvements in $k^2$ and losses due to the layer stack of waveguide layers makes the SAW device suitable for applications at 5 GHz which require high $k^2$ and Q.

The invention described herein is not limited by the description in conjunction with the exemplary embodiments. Rather, the invention comprises any new feature as well as any combination of features, particularly including any combination of features in the patent claims, even if said feature or said combination per se is not explicitly stated in the patent claims or exemplary embodiments.

REFERENCE SIGN LIST 1 carrier substrate
2 piezoelectric thin-film
3 interdigital electrode structure 4 layer stack of waveguide layers
5 TCF compensating layer
6 ion blocking layer
31 first electrode
32 second electrode
41 first waveguide layer
42 second waveguide layer

The invention claimed is:

1. A SAW device comprising:
   a carrier substrate,
   a piezoelectric thin-film on the carrier substrate,
   an interdigital electrode structure on the piezoelectric thin-film,
   a layer stack of waveguide layers, the layer stack being arranged between the carrier substrate and the piezoelectric thin-film, wherein
   the layer stack comprises a first waveguide layer and a second waveguide layer,
   a sound velocity in the first waveguide layer is at least 1.5 times as great as a sound velocity in the second waveguide layer, and
   a TCF compensating layer having a positive temperature coefficient of frequency arranged between the layer stack and the carrier substrate.

2. The SAW device according to claim 1, wherein the layer stack comprises several of the first waveguide layers and several of the second waveguide layers, wherein the first waveguide layers and the second waveguide layers are arranged alternately.

3. The SAW device according to claim 1, wherein:
   the sound velocity in the first waveguide layer is greater than a sound velocity in the piezoelectric thin-film, and
   the sound velocity in the second waveguide layer is smaller than the sound velocity in the piezoelectric thin-film.

4. The SAW device according to claim 1, wherein a mean thickness of the first and/or second waveguide layer is at most $\lambda/4$, wherein $\lambda$ is the wavelength of a main sound wave during operation of the SAW device.

5. The SAW device according to claim 4, wherein a mean thickness of the piezoelectric thin-film is at most $0.6\lambda$.

6. The SAW device according to claim 1, wherein:
   the first waveguide layer comprises one or more of the following materials: AlN, SiC, $Al_2O_3$, diamond like carbon, TiN, and
   the second waveguide layer comprises one or more of the following materials: $SiO_2$, $Si_3N_4$, doped $SiO_2$, $GeO_2$.

7. The SAW device according to claim 1, wherein a polycrystalline silicon layer is arranged between the layer stack and the carrier substrate.

8. The SAW device according to claim 1, wherein the SAW device comprises a SAW resonator, the interdigital electrode structure on the piezoelectric thin-film forming an interdigital transducer of the SAW resonator.

9. The SAW device according to claim 8, wherein the SAW resonator has a resonant frequency of at least 2.5 GHz.

10. A SAW device comprising:
    a carrier substrate;
    a piezoelectric thin-film on the carrier substrate;
    an interdigital electrode structure on the piezoelectric thin-film;
    a layer stack of waveguide layers, the layer stack being arranged between the carrier substrate and the piezoelectric thin-film, wherein
    the layer stack comprises a first waveguide layer and a second waveguide layer, and
    a sound velocity in the first waveguide layer is at least 1.5 times as great as a sound velocity in the second waveguide layer; and
    a dielectric ion blocking layer arranged between the layer stack and the carrier substrate.

11. The SAW device according to claim 10, wherein the dielectric ion blocking layer comprises polycrystalline silicon.

12. The SAW device according to claim 10, wherein:
    the first waveguide layer comprises at least one or more of the following materials: AlN, SiC, $Al_2O_3$, diamond like carbon, TiN; and
    the second waveguide layer comprises at least one or more of the following materials: $SiO_2$, $Si_3N_4$, doped $SiO_2$, $GeO_2$.

13. The SAW device according to claim 10, wherein the SAW device comprises a SAW resonator, the interdigital electrode structure on the piezoelectric thin-film forming an interdigital transducer of the SAW resonator.

14. The SAW device according to claim 10,
    wherein the layer stack comprises several of the first waveguide layer and several of the second waveguide layer arranged alternately with the several of the first waveguide layer.

15. The SAW device according to claim 10, wherein:
    the sound velocity in the first waveguide layer is greater than a sound velocity in the piezoelectric thin-film, and
    the sound velocity in the second waveguide layer is smaller than the sound velocity in the piezoelectric thin-film.

* * * * *